US007123528B2

(12) United States Patent
Jeong et al.

(10) Patent No.: US 7,123,528 B2
(45) Date of Patent: Oct. 17, 2006

(54) FLASH MEMORY DEVICE HAVING COLUMN PREDECODER CAPABLE OF SELECTING ALL COLUMN SELECTION TRANSISTORS AND STRESS TEST METHOD THEREOF (75) Inventors: Jae-Yong Jeong, Suwon-shi (KR); Heung-Soo Lim, Yongin-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 25 days.

(21) Appl. No.: 10/677,841

(22) Filed: Oct. 1, 2003

(65) Prior Publication Data
US 2004/0233703 A1  Nov. 25, 2004

(30) Foreign Application Priority Data
Dec. 12, 2002  (KR) ............... 10-2002-0079083

(51) Int. Cl.
*G11C 29/00* (2006.01)
(52) U.S. Cl. ............ 365/201; 365/185.33; 365/230.06
(58) Field of Classification Search ............... 365/201, 365/185.33, 230.08, 230.06, 189.05, 189.11
See application file for complete search history.

(56) References Cited
U.S. PATENT DOCUMENTS 5,243,569 A * 9/1993 Atsumi ................ 365/201
5,559,744 A * 9/1996 Kuriyama et al. .......... 365/201
5,654,925 A * 8/1997 Koh et al. .................. 365/201
6,236,594 B1 * 5/2001 Kwon .................. 365/185.11

FOREIGN PATENT DOCUMENTS

JP      04-163798    6/1992
KR   2002-58992    7/2002

OTHER PUBLICATIONS

English Language of Abstract of Korean Patent Publication No. 2002-58992.
English Language of Abstract of Japanese Patent Publication No. 04-163798.

\* cited by examiner

*Primary Examiner*—Anh Phung
*Assistant Examiner*—Pho M. Luu
(74) *Attorney, Agent, or Firm*—Marger Johnson & McCollom, P.C.

(57) ABSTRACT

A column predecoder includes a buffer unit for inputting all column selection signals, decoder units for decoding an output of the buffer unit and column addresses, and level shifters for shifting voltage levels of column selection signals coupled to gates of the column selection transistors in response to an output of the decoder units. Since a ground voltage is applied to a bitline and a high voltage is applied to all column selection signals during the stress test, the stress test time can be shortened.

20 Claims, 6 Drawing Sheets

(PRIOR ART)

FLASH MEMORY DEVICE HAVING COLUMN PREDECODER CAPABLE OF SELECTING ALL COLUMN SELECTION TRANSISTORS AND STRESS TEST METHOD THEREOF

CROSS REFERENCE TO RELATED APPLICATIONS

This application claims priority from Korean Patent Application No. 2002-79083, filed on Dec. 12, 2002, the contents of which are hereby incorporated by reference in their entirety.

BACKGROUND OF THE INVENTION

1. Technical Field of the Invention

This disclosure relates to a flash memory device and, more particularly, to a flash memory device having a column predecoder capable of selecting all column selection transistors and a stress test method thereof.

2. Description of the Related Art

A flash memory device is a highly integrated information storage device in which write and erase operations can be done on board. A flash memory cell includes one field effect transistor (FET) having a selection gate, a floating gate, a source, and a drain. Variation of a threshold voltage of the flash memory cell results in fluctuation of the amount of charges on a floating gate. The fluctuation is information, which is stored in the flash memory cell. A flash memory device is classified as either a NAND flash memory device or a NOR flash memory device. NAND flash memory devices are used as a mass data storage devices, and NOR flash memory devices are used as information storage devices for processing data at a high speed.

Generally, a NOR flash memory cell has two states, i.e., a programmed state and an erased state. When the NOR flash memory cell is programmed, residual electrons are trapped on a floating gate and a threshold voltage rises. Thus, drain-source current does not flow to a selected flash memory cell. The programmed state of the flash memory cell is called a logic "0". When the flash memory cell is erased, there are a small number of residual electrons on the floating gate or lots of source-drain current flows to the flash memory cell. The erased state of the flash memory cell is called a logic "1".

A typical NOR flash memory device is now described below with reference to FIG. 1.

Figure 1:
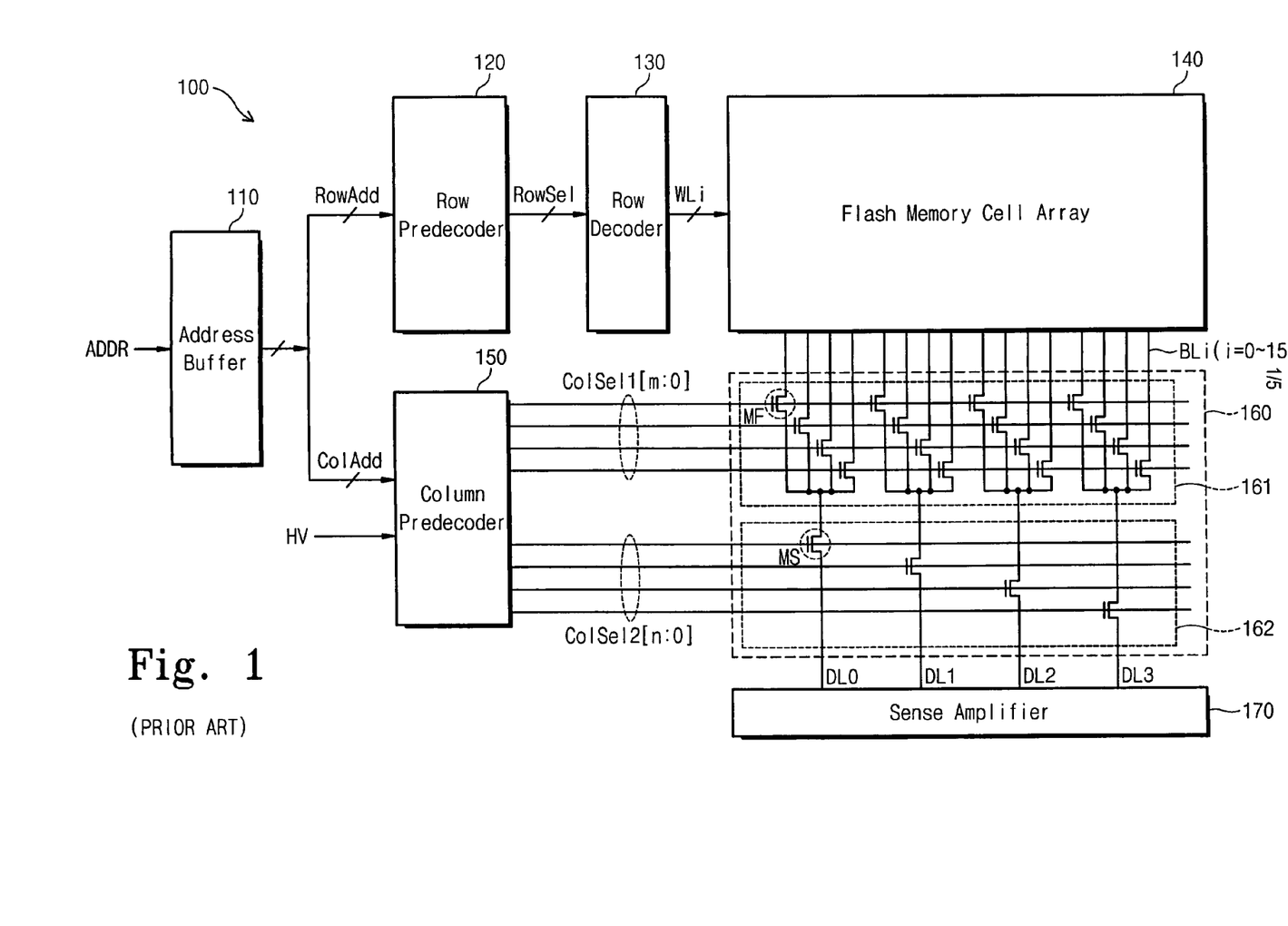
FIG. 1 is a block/circuit diagram illustrating a conventional flash memory device.

Referring to FIG. 1, a NOR flash memory device 100 includes an address buffer 110, a row predecoder 120, a row decoder 130, a cell array 140, a column predecoder 150, a column decoder 160, and a sense amplifier 170. In the cell array 140, flash memory cells (not shown) are arranged at intersections of wordlines WLi and bitlines BLi. The address buffer 110 receives an address signal ADDR from the outside so as to program or erase the flash memory cells and divides a row address RowAdd from a column address ColAdd by means of an output of the address buffer 110. The row predecoder 120 decodes the received row address RowAdd to generate a row selection signal RowSel. The row decoder 130 enables a predetermined wordline WLi in response to the row selection signal RowSel and drives the wordline WLi to a predetermined voltage level according to an operation mode of the flash memory device 100. In a program mode, the wordline WLi is driven to a voltage level of 10V. In an erase mode, it is driven to a voltage level of –10V. In a read mode, it is driven to a voltage level of 4.5V.

The column predecoder 150 decodes the received column address ColAdd to generate column selection signals ColSel1[m:0] and ColSel2[n:0]. The column decoder 160 selects a predetermined bitline BLi in response to the column selection signals ColSel1[m:0] and ColSel2[n:0] and connects a selected bitline BLi with the sense amplifier 170 through a data line DLi. For the convenience of description, 16 bitlines BLi (i=0–15) are exemplarily described. A first column selection signal ColSel1[m:0] selects four bitlines BLi and a second column selection signal ColSel2[n:0] selects one of the selected four bitlines BLi to connect the selected one bitline with the data line DLi.

The column predecoder 150 is now explained in detail with reference to FIG. 2.

Figure 2:
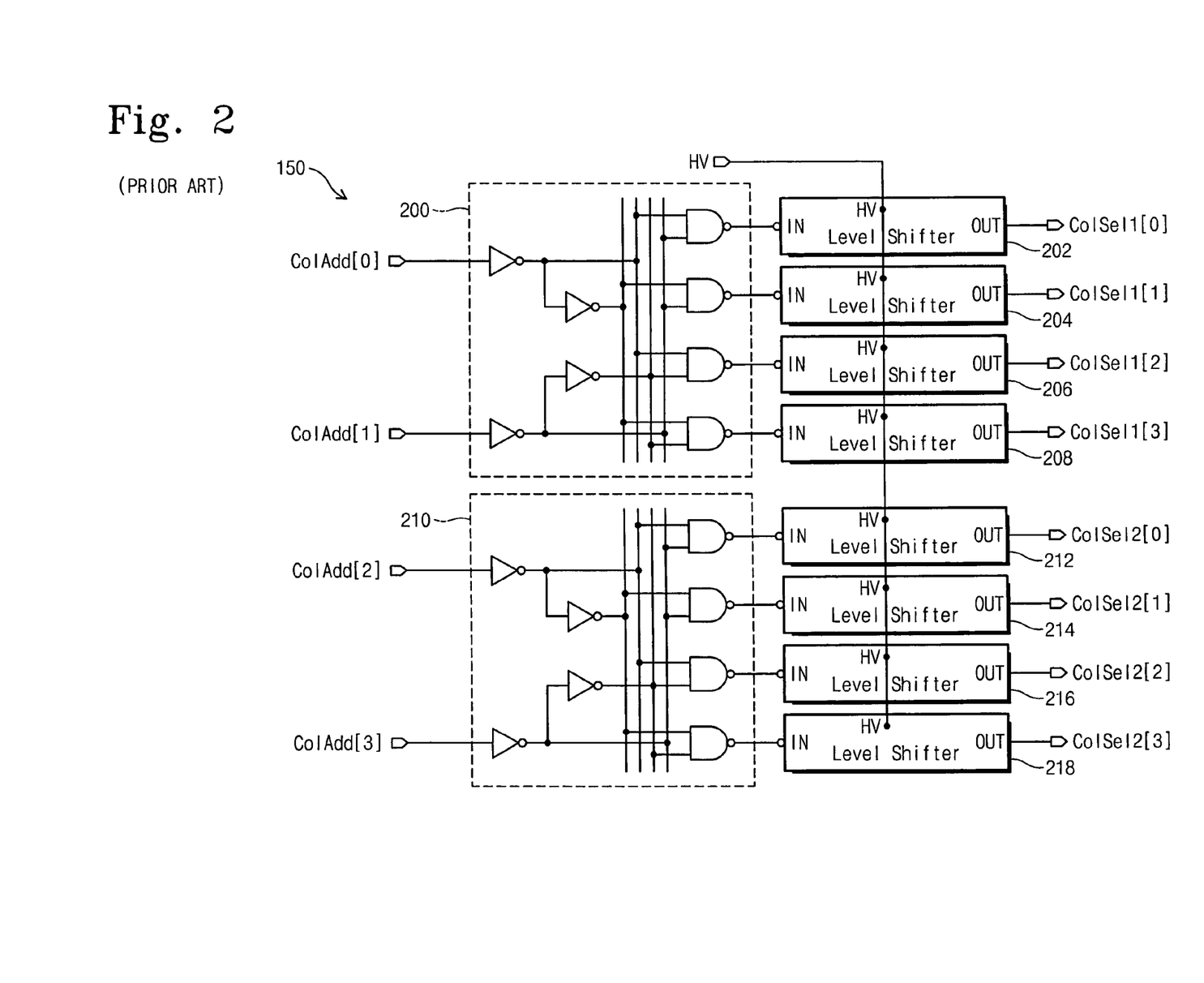
FIG. 2 is a circuit diagram illustrating the column predecoder of FIG. 1.
Figure 3:
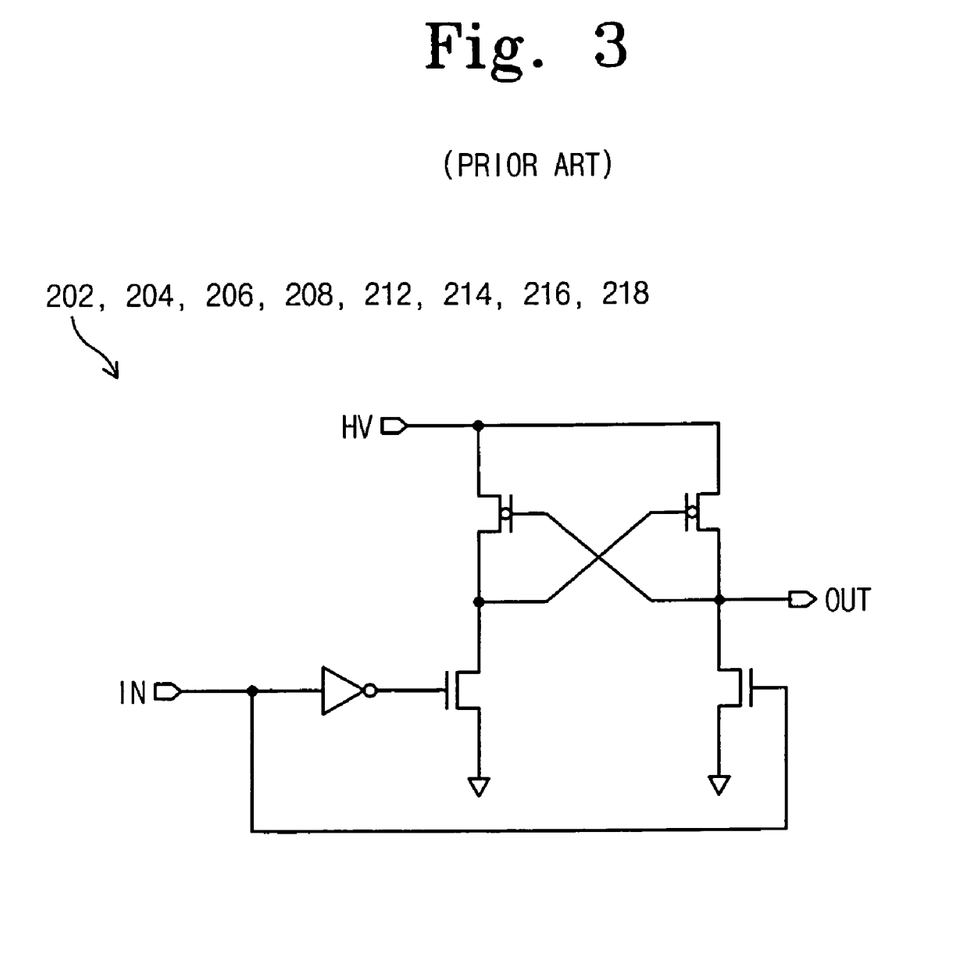
FIG. 3 is a circuit diagram illustrating the level shifter of FIG. 2.

Referring to FIG. 2, the column predecoder 150 inputs column addresses ColAdd[3:0] to selectively generate first column selection signals ColSel1[3:0] and second column selection signals ColSel2[3:0]. The first and second column addresses ColAdd[0] and ColAdd[1] are decoded through a decoding block 200 to drive level shifters 202, 204, 206, and 208. Each of the level shifters 202, 204, 206, and 208 is structured as shown in FIG. 3 and generates a high voltage HV of about 10V as its output OUT in response to a low-level input signal IN. Four transistors in the column decoder 160 corresponding to the first column selection signals ColSel1[0], ColSel1[1], ColSel1[2], and ColSel1[3], respectively, are turned on when a high voltage HV appears as the output OUT of the level shifter 202, 204, 206, or 208, respectively. The third and fourth column addresses ColAdd[2] and ColAdd[3] generate second column selection signals ColSel2[0], ColSel2[1], ColSel2[2], and ColSel2[3] of high voltage HV through a decoding block 210 and level shifters 212, 214, 216, and 218. The second column selection signals ColSel2[0], ColSel2[1], ColSel2[2], and ColSel2[3] of high voltage HV select one of the four bitlines (BLi of FIG. 1). Each bitline BLi is coupled to one of the four transistors that are turned by an activated first column selection signal ColSel1[0], ColSel1[1], ColSel1[2], or ColSel1[3]. In this way the selected signal is connected with a data line DLi.

Figure 4A:
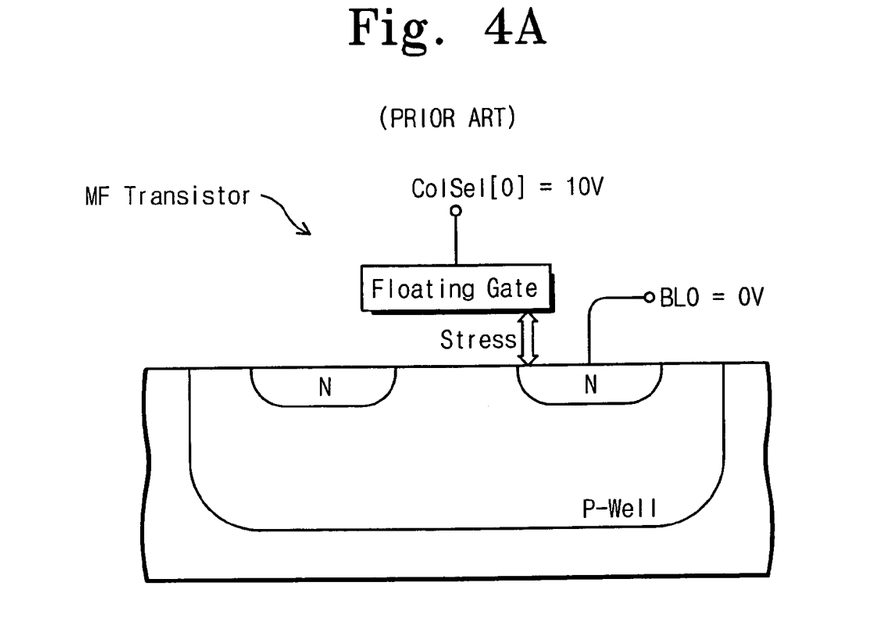
FIG. 4A and FIG. 4B are cross-sectional diagrams illustrating the column selection transistors of FIG. 1 and where stresses occur in those transistors.
Figure 4B:
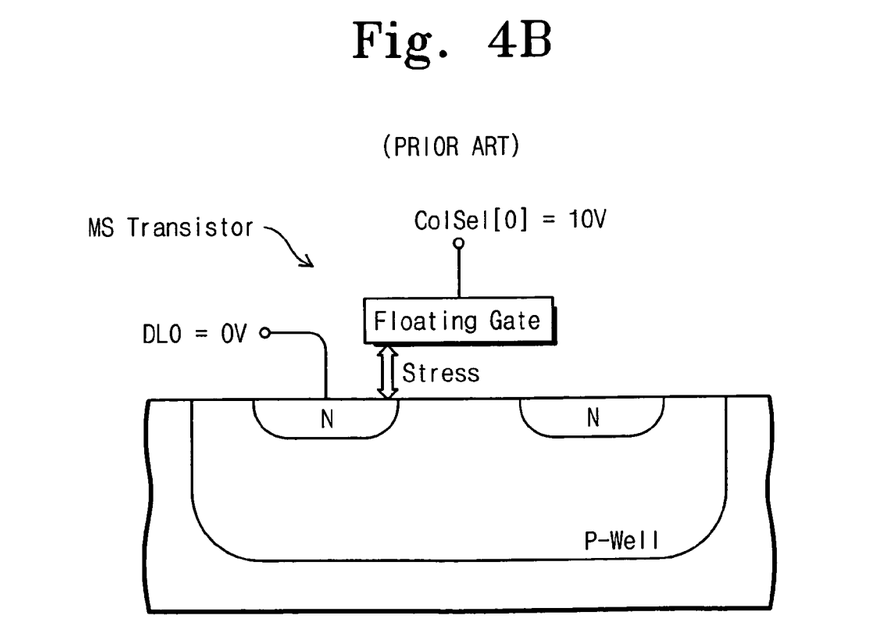

When the flash memory device (100 of FIG. 1) is in the program mode, a voltage of 5V~0V is applied to a bitline of a memory cell selected according to a programming type and a voltage of 0V is applied to a bitline of an unselected memory cell. The state of the bias of a transistor MF in a first group of transistors 161 coupled to the bitline of the unselected memory cell is now described below with reference to FIG. 4A. A high voltage of about 10V is applied to a gate by a first column selection signal ColSel1[0] that is coupled to the gate. A voltage of 0V is applied to a source by a bitline BL0 that is coupled to the gate. Thus, a voltage of 10V is applied between the gate and the source of the transistor MF, and a voltage of 0V is applied to the data line DL0 of FIG. 1 that is coupled to the unselected memory cell. The state of the bias of a transistor MS in a second group of transistors 162 (FIG. 1) is now described below with reference to FIG. 4B. A high voltage of about 10V is applied to a gate by a second column selection signal ColSel2[0] that is coupled to the gate, and a voltage of 0V is applied to a drain by the data line DL0 that is coupled to the drain. This state is maintained until the program is completed, which leads to increased gate oxide stress of the transistors MF and MS.

Furthermore, when the flash memory device (100 of FIG. 1) is in an erase mode, a voltage of about 9V is applied to a bulk that is coupled to a bitline. In this case, the first and second column selection signals ColSel1[m:0] and ColSel2[n:2] have a voltage of about 0V. Accordingly, a voltage of 0V is applied to the gates of the first group of the transistors 161 and a coupling voltage of 9V is applied to the sources thereof. As a result, gate oxide stress in the first group of transistors 161 occurs.

Over time, oxide stress from repeated program and erase operations degrades the gate oxide layer to cause errors in a transistor. This contributes to faulty operation of a flash memory device. Accordingly, there is a need for a method of detecting a transistor error caused by the degradation of the gate oxide layer.

Since the first and second column selection signals ColSel1[m:0] and ColSel2[n:2] alternately apply a high voltage, it takes a long time to screen the transistor error by applying a stress to the first and second groups of the transistors in the column decoder (160 of FIG. 1).

Embodiments of the invention address these and other disadvantages of the prior art.

SUMMARY OF THE INVENTION

Embodiments of the invention provide a flash memory device having a column predecoder that can significantly shorten a stress test time.

Other embodiments of the invention provide a stress test method for a flash memory device.

DETAILED DESCRIPTION OF THE INVENTION

Figure 5:
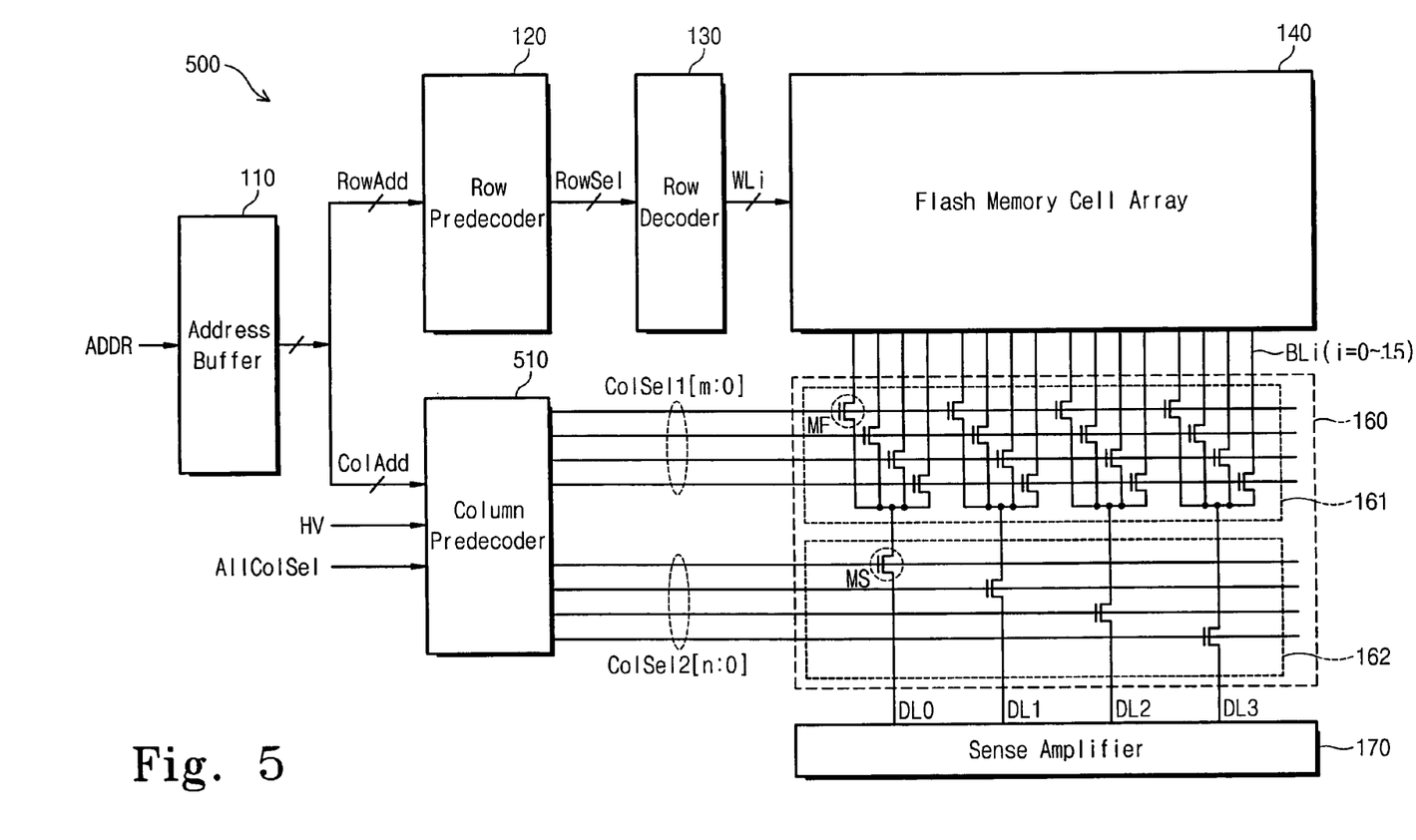
FIG. 5 is a block/circuit diagram illustrating a flash memory device according to an embodiment of the invention.

Referring to FIG. 5, a flash memory device 500 is substantially similar to the flash memory device 100 shown in FIG. 1 except in regards to a column predecoder 510. The column predecoder 510 selectively or entirely generates column selection signals ColSel1[m:0] and ColSel2[n:0] in response to a column address ColAdd and an all column selection signal AllColSel. The column predecoder 510 is now explained in detail with reference to FIG. 6.

Figure 6:
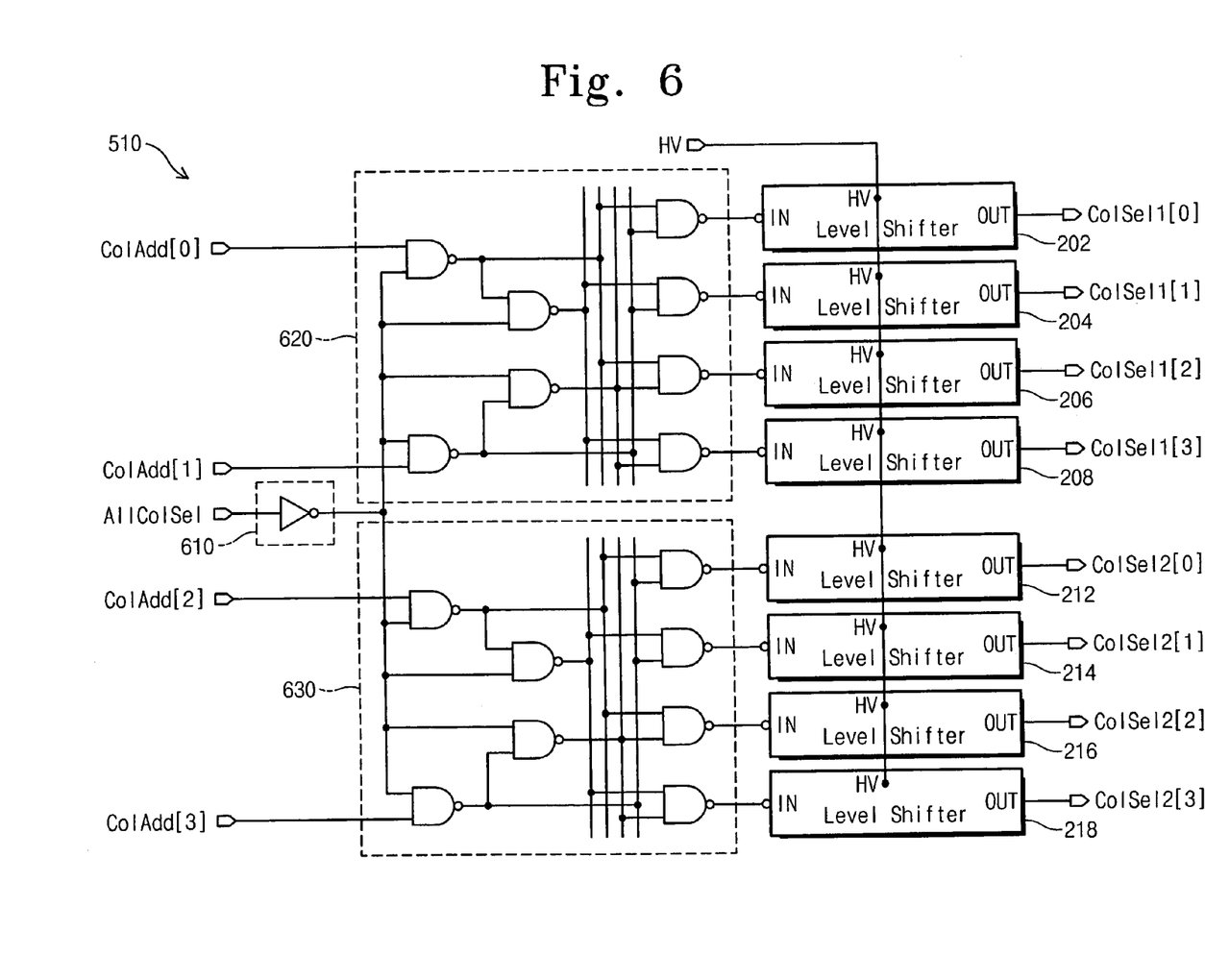
FIG. 6 is a circuit diagram illustrating the column predecoder of FIG. 5.

Referring to FIG. 6, the column predecoder 510 includes a buffer unit 610, decoder units 620 and 630, and level shifters 202, 204, 206, 208, 212, 214, 216, and 218. These level shifters 202, 204, 206, 208, 212, 214, 216, and 218 are identical to those of FIG. 3. The buffer unit 610 is composed of an inverter that receives as input the all column selection signal AllColSel. When AllColSel is activated high, an output of the buffer unit 610 is low. The decoder units 620 and 630 combine column addresses ColAdd[0], ColAdd[1], ColAdd[2], and ColAdd[3] and the output of the buffer unit 610. The outputs of the first and second decoder units 620 and 630 are used by the level shifters 202, 204, 206, 208, 212, 214, 216, and 218 to generate first and second column selection signals ColSel1[0], ColSel1[1], ColSel1[2], ColSel1[3], ColSel2[0], ColSel2[1], ColSel2[2], and ColSel2[3], respectively.

When the output of the buffer unit 610 is low, the outputs of the decoders 620 and 630 become low, causing the level shifters 202, 204, 206, 208, 212, 214, 216, and 218 to generate ColSel1[0], ColSel1[1], ColSel1[2], ColSel1[3], ColSel2[0], ColSel2[1], ColSel2[2],and ColSel2[3] at the high voltage (HV). The high voltage HV is then applied to the gates of the column selection transistors 161 and 162 in the column decoder 160 of FIG. 1, thereby turning on the column selection transistors. Preferably, the column selection transistors 161 and 162 are composed of NMOS transistors. A high voltage may be directly applied from an external source that is higher than the power supply voltage, which means that a stress application test may be conducted at one time for all the column selection transistors 161 and 162. During the stress test, the potential of the bitlines BLi is about 0V.

When the all column selection signal AllColSel is deactivated low, the output of the buffer 610 is high. When the output of the buffer 610 is high, the decoder units 620 and 630 operate the same way as the decoders 200 and 210 of FIG. 2. That is, when the first column selection signals ColSel1[0], ColSel1[1], ColSel1[2], and ColSel1[3] are at a high voltage level, each signal turns on four transistors among the first group of the column selection transistors (161 of FIG. 5). The third and fourth column addresses ColAdd[2] and ColAdd[3] generate the second column selection signals ColSel2[0], ColSel2[1], ColSel2[2], and ColSel2[3] through the decoding block 630 and the level shifters 212, 214, 216, and 218. When a second column selection signal ColSel2[0], ColSel2[1], ColSel2[2], and ColSel2[3] is at the high voltage level, it activates one of the four transistors in the second group of column selection transistors 162. This connects the selected data line DLi to a bitline BLi (see FIG. 5) that is coupled to one of the four column selection transistors turned on by an activated first column selection signals ColSel1[0], ColSel1[1], ColSel1[2], and ColSel1[3].

Alternatively, the high voltage applied by the column selection signal may be directly applied from a variable external voltage source.

According to embodiments of the invention, a column predecoder simultaneously selects all column selection transistors to conduct a stress test. Therefore, the time required for the stress test can be shortened.

Embodiments of the invention will now be described in a non-limiting way.

In accordance with an embodiment of the invention, a flash memory device has a column predecoder for controlling column selection transistors that select a predetermined bitline among a plurality of bitlines coupled to flash memory cell. The column predecoder includes a buffer unit that has as input an all column selection signal, decoder units for decoding an output of the buffer unit and column addresses, and level shifters for shifting the voltage levels of column selection signals that are coupled to gates of the column selection transistors in response to an output of the decoder units. During a stress test, the flash memory device responds to the all column selection signal and applies a high voltage of 10V or higher to the gates of the transistors. Thus, the stress test is conducted for column selection transistors with bitlines at a constant voltage level, e.g., a ground voltage level.

Preferably, the buffer unit includes an inverter that receives as input the all column selection signal. Each of the decoder units includes a NAND gate for inputting an output of the buffer and the column address. The level shifter includes first and second PMOS transistors, an inverter for inputting the output of the decoder unit, and first and second NMOS transistors. Sources of the first and second PMOS transistors are coupled to a high voltage, and their gates are cross-coupled to their drains. The first NMOS transistor is coupled between the drain of the first PMOS transistor and a ground voltage and gates to the output of the inverter. The second NMOS transistor is coupled between the drain of the second PMOS transistor and the ground voltage and gates to the output of the decoder unit. In addition, the second NMOS transistor has a drain coupled to the drain of the second PMOS transistor to generate the column selection signal.

The flash memory device further includes a column decoder for dividing the column selection transistors into predetermined stages. The column decoder includes first-stage column selection transistors for selecting at least two bitlines from among all the bitlines in response to a group of the column selection signals and second-stage column selection transistors for selecting a predetermined one of the bitlines selected by the first-stage column selection transistors in response to another group of the column selection signals in order to connect the selected bitline with a data line.

Another embodiment of the invention provides a stress test method for a flash memory device having column selection transistors that select a predetermined bitline among a plurality of bitlines coupled to flash memory cells. The stress test method includes activating all the column selection signals, applying column selection signals coupled to gates of the column selection transistors to a high voltage in response to the activation of all the column selection signals, and decoding inputted column addresses in response to deactivation of all the column selection signals in order to selectively turn on the column selection transistors. Preferably, the stress test is conducted for column selection transistors with bitlines at a constant voltage level, e.g., a ground voltage level.

While the specific embodiments described above may be susceptible to various modifications and alternative forms, these embodiments were given only as examples and it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A stress test method for a flash memory device having column selection transistors configured to select a predetermined bitline from among a plurality of bitlines that are coupled to flash memory cells, the stress test method comprising:
   activating a plurality of column selection signals to a high voltage provided directly from an external source;
   applying the plurality of column selection signals to all the column selection transistors;
   deactivating all the column selection signals; and
   turning on selected ones of the column selection transistors in response to a column address.

2. The stress test method of claim 1, wherein providing the high voltage directly from an external source comprises providing the high voltage with a voltage level higher than a power supply voltage.

3. The stress test method of claim 1, wherein the column selection transistors are NMOS transistors.

4. A stress test method for a flash memory device having column selection transistors configured to select a predetermined bitline from among a plurality of bitlines that are coupled to flash memory cells, the stress test method comprising:
   activating a plurality of column selection signals to a high voltage;
   applying the plurality of column selection signals to all the column selection transistors;
   deactivating all the column selection signals;
   turning on selected ones of the column selection transistors in response to a column address; and
   applying a constant voltage to the plurality of bitlines.

5. The stress test method of claim 4, wherein applying a constant voltage to the plurality of bitlines comprises applying a ground voltage.

6. A flash memory device with a column predecoder, the column predecoder configured to control column selection transistors that select a predetermined bitline from among a plurality of bitlines that are coupled to flash memory cells, the column predecoder comprising:
   a buffer unit configured to receive as input an all column selection signal;
   decoder units configured to decode an output of the buffer unit and a column address; and
   level shifters configured to generate column selection signals that are applied to gates of the column selection transistors in response to an output of the decoder units, wherein the level shifters are configured to apply a high voltage to all the column selection transistors during a stress test in response to the all column selection signal, the level shifters including
      first and second PMOS transistors each having a source, a drain, and a gate, wherein the sources of the first and second PMOS transistors are coupled to a high voltage and the gates thereof are cross-coupled to the drains thereof,
      an inverter configured to invert the output of the decoder unit,
      a first NMOS transistor coupled between the drain of the first PMOS transistor and a ground voltage, with a gate coupled to an output of the inverter, and
      a second NMOS transistor coupled between the drain of the second PMOS transistor and the ground voltage, with a gate coupled to the output of the decoder unit, and with a drain coupled to the drain of the second PMOS transistor to generate the column selection signal.

7. The flash memory device of claim 6, wherein the buffer unit comprises an inverter.

8. The flash memory device of claim 6, wherein each of the decoder units comprise a NAND gate configured to receive as input the output of the buffer unit and the column address.

9. The flash memory device of claim 6, wherein the high voltage is provided directly from an external source.

10. The flash memory device of claim 6, wherein the high voltage has a voltage level higher than a power supply voltage.

11. The flash memory device of claim 6, wherein a constant voltage level is applied to the bitline during the stress test.

12. The flash memory device of claim 11, wherein the constant voltage level is a ground voltage level.

13. A flash memory device comprising:
   a column predecoder, the column predecoder configured to control column selection transistors that select a predetermined bitline from among a plurality of bitlines that are coupled to flash memory cells, the column predecoder including
  a buffer unit configured to receive as input an all column selection signal,
  decoder units configured to decode an output of the buffer unit and a column address, and
  level shifters configured to generate column selection signals that are applied to gates of the column selection transistors in response to an output of the decoder units, wherein the level shifters are configured to apply a high voltage to all the column selection transistors during a stress test in response to the all column selection signal; and
a column decoder, the column decoder configured to divide the column selection transistors into predetermined stages, the column decoder including
  first-stage column selection transistors configured to select at least two bitlines from among the plurality of bitlines in response to a group of the column selection signals, and
  second-stage column selection transistors configured to select a predetermined one of the at least two bitlines in response to another group of the column selection signals and connect the predetermined one of the at least two bitlines with a data line.

14. The flash memory device of claim 13, wherein the column selection transistors are NMOS transistors.

15. The flash memory device of claim 13, wherein the buffer unit comprises an inverter.

16. The flash memory device of claim 13, wherein each of the decoder units comprise a NAND gate configured to receive as input the output of the buffer unit and the column address.

17. The flash memory device of claim 13, wherein the high voltage is provided directly from an external source.

18. The flash memory device of claim 13, wherein the high voltage has a voltage level higher than a power supply voltage.

19. The flash memory device of claim 13, wherein a constant voltage level is applied to the bitline during the stress test.

20. The flash memory device of claim 19, wherein the constant voltage level is a ground voltage level.

* * * * *